US012773723B2

(12) United States Patent
Huang et al.

(10) Patent No.: US 12,773,723 B2
(45) Date of Patent: Oct. 27, 2026

(54) WAFER PROCESSING METHOD

(71) Applicant: GRAND PROCESS TECHNOLOGY CORPORATION, Hsinchu City (TW)

(72) Inventors: Li-tso Huang, Hsinchu City (TW); Hsiu-kai Chang, Hsinchu City (TW); Chin-yuan Wu, Hsinchu City (TW); Ming-che Hsu, Hsinchu City (TW)

(73) Assignee: GRAND PROCESS TECHNOLOGY CORPORATION, Hsinchu City (TW)

( * ) Notice: Subject to any disclaimer, the term of this patent is extended or adjusted under 35 U.S.C. 154(b) by 177 days.

(21) Appl. No.: 18/829,924

(22) Filed: Sep. 10, 2024

(65) Prior Publication Data

US 2025/0058363 A1 Feb. 20, 2025

Related U.S. Application Data

(62) Division of application No. 18/181,989, filed on Mar. 10, 2023, now Pat. No. 12,128,452.

(30) Foreign Application Priority Data

Mar. 2, 2023 (TW) ................................ 112107682

(51) Int. Cl.
*B08B 3/02* (2006.01)
*H10P 72/00* (2026.01)
*H10P 72/76* (2026.01)

(52) U.S. Cl.
CPC .......... *B08B 3/022* (2013.01); *H10P 72/0414* (2026.01); *H10P 72/7618* (2026.01)

(58) Field of Classification Search
CPC ............. H10P 72/0402; H10P 72/0404; H10P 72/0406; H10P 72/0411; H10P 72/0414; H10P 72/0416; H10P 72/0422; H10P 72/0424; H10P 72/0426; H10P 72/7604; H10P 72/7618; H10P 72/78
See application file for complete search history.

(56) References Cited

U.S. PATENT DOCUMENTS

| | | | | | |
|---|---|---|---|---|---|
| 5,882,433 | A * | 3/1999 | Ueno | H10P 72/0406 | 134/33 |
| 2005/0260345 | A1 * | 11/2005 | Lubomirsky | H10P 72/7608 | 118/52 |
| 2023/0149980 | A1 * | 5/2023 | Cheng | B08B 3/02 | 134/34 |

* cited by examiner

*Primary Examiner* — David G Cormier

(57) ABSTRACT

A wafer processing method is provided. The method includes a device providing step, a first lifting step, a wafer placing step, a second lifting step, a soaking step, and a third lifting steps, and a spinning cleaning step. The device providing step includes providing a multifunctional single wafer immersion and spin cleaning device, the device has a spin drive device, a wafer turntable, and a wafer receiving tray. A soaking tank is formed on the wafer receiving tray, and a watertight contact gasket is disposed on the wafer receiving tray to contact the wafer water-tightly such that in the soaking step, an appropriate water level of the liquid medicine can be accumulated to fully soak the wafer.

7 Claims, 12 Drawing Sheets

WAFER PROCESSING METHOD

CROSS REFERENCE TO RELATED APPLICATIONS

This application is a divisional of U.S. application Ser. No. 18/181,989, filed Mar. 10, 2023, which claims priority to Taiwanese Application No. 112107682, filed Mar. 2, 2023, the entireties of which are hereby incorporated herein by reference.

FIELD OF INVENTION

The present invention relates to a single wafer cleaning device, especially to a multifunctional single wafer soaking-spinning-cleaning device and a wafer processing method.

BACKGROUND OF INVENTION

A conventional cleaning process requires the wafer surface to be soaked in chemical solution for a sufficient time to generate an effective chemical cleaning reaction. A general semiconductor single wafer spin cleaning apparatus cannot implement a soaking process on a wafer spin chuck such that it is required to implement a soaking cleaning process to a wafer in an exclusive soaking tank to make solution chemically react with the wafer sufficiently for implementation of an initial cleaning process. Then, the initially cleaned wafer is transported to a single wafer spin clean chamber by a transfer robot for implementation of the subsequent processes of wafer spin cleaning and spin-drying.

Completing the above cleaning steps requires placing the wafer in different devices respectively which makes the entire cleaning process complicated and increases processing time and production costs.

Therefore, the current wafer cleaning process urgently requires a single wafer cleaning apparatus able to complete the above complicated cleaning steps and incorporate multiple cleaning steps therein to improve the process efficiency and reduce the production costs.

SUMMARY OF INVENTION

A main objective of the present invention is to provide a multifunctional single wafer soaking-spinning-cleaning device disposing a wafer support disk around a periphery of a wafer spin chuck. The wafer support disk can ascend and descend relative to the wafer spin chuck, and set the wafer in the soaking trough in the wafer support disk when wafer support disk is in an ascending position to achieve a goal of sufficiently soaking the wafer in a solution.

To achieve to above objective, the present invention provides a multifunctional single wafer soaking-spinning-cleaning device, comprising:

a spin driver device;

a wafer spin chuck connected to the spin driver device, driven by the spin driver device to spin, and configured to fasten a wafer placed on a top surface of the wafer spin chuck; and a wafer support disk being annular, surrounding an outer side of the wafer spin chuck, and configured to ascend to a wafer supporting position relative to the wafer spin chuck or descend to a wafer separation position relative to the wafer spin chuck, wherein the wafer support disk comprises a base disk portion and an outer annular wall portion protruding from an outer edge of the base disk portion, a soaking trough is formed between the base disk portion and the outer annular wall portion and is configured to accommodate the wafer, a watertight sealing contact pad is disposed on a wafer contact top surface of the base disk portion and is configured to watertightly contact the wafer, and an accommodation hole is defined through the wafer support disk and communicates with the soaking trough for the wafer spin chuck entering and exiting out of the accommodation hole;

wherein when the wafer support disk ascends to the wafer supporting position, the watertight sealing contact pad of the base disk portion is flush with the top surface of the wafer spin chuck; and when the wafer support disk descends to the wafer separation position, the watertight sealing contact pad of the base disk portion is lower than the top surface of the wafer spin chuck.

In a preferred embodiment of the present invention, the watertight sealing contact pad is annular and partially or fully covers the wafer contact top surface.

In a preferred embodiment of the present invention, a liquid collection trough is formed in the wafer contact top surface of the base disk portion of the wafer support disk, and the liquid collection trough is located below the soaking trough and communicates with the soaking trough.

In a preferred embodiment of the present invention, the watertight sealing contact pad is annular and surrounds the liquid collection trough.

In a preferred embodiment of the present invention, the watertight sealing contact pad is annular and is distributed above the liquid collection trough, a distance from an annular outer side of the watertight sealing contact pad to the accommodation hole is greater than a farthest distance between the liquid collection trough and the accommodation hole, and at least one through hole is defined through the watertight sealing contact pad and is aligned with and communicates with the liquid collection trough.

In a preferred embodiment of the present invention, the liquid collection trough is annular, and an inner annular wall portion is formed on the base disk portion between the liquid collection trough and the accommodation hole.

In a preferred embodiment of the present invention, a top end of the inner annular wall portion is flush with the wafer contact top surface.

In a preferred embodiment of the present invention, the liquid collection trough and the outer annular wall portion is at an interval.

In a preferred embodiment of the present invention, at least one liquid discharge hole is defined through the base disk portion and communicates with the liquid collection trough.

In a preferred embodiment of the present invention, a discharge pipe is formed on and protrudes from a bottom surface of the base disk portion and corresponds to the liquid discharge hole.

In a preferred embodiment of the present invention, the wafer contact top surface of the base disk portion is a flat surface.

In a preferred embodiment of the present invention, a vacuum pump connection port is disposed on the spin driver device, a vacuum suction hole is formed through the wafer spin chuck and communicates with the vacuum pump connection port, and the vacuum suction hole is configured to secure the wafer on the wafer spin chuck.

In a preferred embodiment of the present invention, at least one liquid nozzle is disposed on the outer annular wall portion of the wafer support disk and extends into the soaking trough.

In a preferred embodiment of the present invention, the wafer support disk is connected to a lifting drive mechanism, and the lifting drive mechanism is configured to drive the wafer support disk to ascend or descend relative to the wafer spin chuck.

In a preferred embodiment of the present invention, the wafer spin chuck is connected to a lifting drive mechanism, and the lifting drive mechanism is configured to drive the wafer spin chuck relative to the wafer support disk.

In a preferred embodiment of the present invention, the lifting drive mechanism is mounted securely on the spin driver device.

In a preferred embodiment of the present invention, the lifting drive mechanism is one of a pneumatic cylinder, a hydraulic cylinder, an electromagnetic valve, and a motor.

In a preferred embodiment of the present invention, the spin driver device comprises a motor, and the motor is connected to the wafer spin chuck by a spin shaft to drive the wafer spin chuck to spin.

Another objective of the present invention another is to provide a wafer processing method, comprising:

a device providing step comprising providing multifunctional single wafer soaking-spinning-cleaning device comprising:

a spin driver device;

a wafer spin chuck connected to the spin driver device, driven by the spin driver device to spin, and configured to fasten a wafer placed on a top surface of the wafer spin chuck; and a wafer support disk being annular, surrounding an outer side of the wafer spin chuck, and configured to ascend or descend relative to the wafer spin chuck, wherein the wafer support disk comprises a base disk portion and an outer annular wall portion protruding from an outer edge of the base disk portion, a soaking trough is formed between the base disk portion and the outer annular wall portion and is configured to accommodate the wafer, a watertight sealing contact pad is disposed on a wafer contact top surface of the base disk portion, and an accommodation hole is defined through the wafer support disk and communicates with the soaking trough;

a first ascending or descending step comprising moving the wafer support disk up or down relative to the wafer spin chuck to a wafer separation position;

a wafer placement step comprising placing a wafer onto the wafer spin chuck;

a second ascending or descending step comprising moving the wafer support disk up or down relative to the wafer spin chuck to a wafer supporting position at which the watertight sealing contact pad watertightly contacts the wafer;

a soaking step comprising spraying a solution on the wafer with the solution flowing in the soaking trough, and stopping spraying when a liquid level of the solution raises to sufficiently soak at least one part of the wafer, wherein a watertight state between the watertight sealing contact pad and the wafer blocks the solution of the soaking trough from further flowing to the accommodation hole;

a third ascending or descending step comprising moving the wafer support disk up or down relative to the wafer spin chuck to the wafer separation position such that the watertight sealing contact pad is separated from the wafer bottom portion to form a gap and the solution is leaked out from the soaking trough through the gap; and a spin-cleaning step comprising spinning the wafer spin chuck and the wafer, and spraying a solution on the wafer to clean the wafer.

In a preferred embodiment of the present invention, after the spin-cleaning step, further comprising:

a deionized water cleaning step comprising stopping spraying the solution, keeping spinning the wafer spin chuck and the wafer, and spraying deionized water on the wafer to clean out the solution; and a spin-drying step comprising stopping spraying the deionized water and keeping spinning the wafer spin chuck and the wafer until the wafer is dry.

In a preferred embodiment of the present invention, when the wafer support disk ascends to the wafer supporting position, the watertight sealing contact pad of the base disk portion is flush with the top surface of the wafer spin chuck; and when the wafer support disk descends to the wafer separation position, the watertight sealing contact pad of the base disk portion is lower than the top surface of the wafer spin chuck.

In a preferred embodiment of the present invention, the watertight sealing contact pad is annular and partially or fully covers the wafer contact top surface.

In a preferred embodiment of the present invention, a liquid collection trough is formed in the wafer contact top surface of the base disk portion of the wafer support disk, and the liquid collection trough is located below the soaking trough and communicates with the soaking trough.

In a preferred embodiment of the present invention, the watertight sealing contact pad is annular and surrounds the liquid collection trough.

In a preferred embodiment of the present invention, the watertight sealing contact pad is annular and is distributed above the liquid collection trough, a distance from an annular outer side of the watertight sealing contact pad to the accommodation hole is greater than a farthest distance between the liquid collection trough and the accommodation hole, and at least one through hole is defined through the watertight sealing contact pad and is aligned with and communicates with the liquid collection trough.

In a preferred embodiment of the present invention, the liquid collection trough is annular, and an inner annular wall portion is formed on the base disk portion between the liquid collection trough and the accommodation hole.

Multifunctional single wafer soaking-spinning-cleaning device of the present invention at least comprises advantages as follows:

1. The multifunctional single wafer soaking-spinning-cleaning device and the wafer processing method applying the device of the present invention dispose a wafer support disk surrounding a periphery of a wafer spin chuck. The wafer support disk is annular and can accommodate a wafer spin chuck, an outer edge of the wafer support disk is a protruding outer annular wall portion. When the wafer support disk ascends to the wafer supporting position and is at the same level with the wafer spin chuck, the wafer support disk exactly tightly supports and surrounds a side surface and a bottom portion of the wafer and makes the wafer seal an accommodation hole in a center of the wafer support disk such that a solution sprayed on the wafer can keep a liquid level in the soaking trough without leaking out from the accommodation hole, and therefore to make the solution to perform a sufficiently soaking effect to the wafer in the soaking trough.

2. The watertight sealing contact pad can watertightly contact the wafer to prevent solution in the soaking trough from flowing into the liquid collection trough and leaking out from a bottom of the wafer support disk, which can maintain a sufficient liquid level of the solution in the soaking trough to implement a fully soaking process to the wafer.
3. After the above soaking step is completed, the wafer support disk can descend to the wafer separation position such that the wafer rises relative to the wafer support disk to make the solution flow into the liquid collection trough of the wafer support disk, and is further discharged from the liquid discharge hole. Alternatively, the accommodation hole can also be designed to have liquid guide and drainage effects. After the wafer support disk descends to the wafer separation position, the spin driver device can drive the wafer spin chuck and the wafer secured on the wafer spin chuck by the vacuum suction force to perform the subsequent cleaning and spin-drying steps to achieve spin cleaning and drying effects to the wafer.
4. According to demands of wafer processes, the solution injected from the process nozzle above the wafer onto the wafer in the soaking trough can be a cleaning solution or an etching solution, and can be deionized water. When the solution is an etching or cleaning solution, the wafer support disk at the wafer supporting position can keep a liquid level of the etching or cleaning solution such that the etching or cleaning solution sufficiently performs the etching or cleaning effect. After the etching or cleaning step is completed, the wafer support disk descends again to the wafer separation position such that the etching solution can be discharged out from the wafer support disk.
5. It is known according to the above four points that the multifunctional single wafer soaking-spinning-cleaning device of the present invention can perform continuous single wafer soaking, spin cleaning, etching, and spin-drying processes on the same wafer spin chuck. Therefore, the present invention can effectively prevent an issue of the above continuous processes requiring a transfer robot to steadily move wafer to independent apparatuses to implement corresponding steps to further simplify wafer cleaning or etching process, reduce the wafer damaging due to frequent wafer transfer, and further improve efficiency and yield of the wafer process.

DETAILED DESCRIPTION OF PREFERRED EMBODIMENTS

Figure 1:
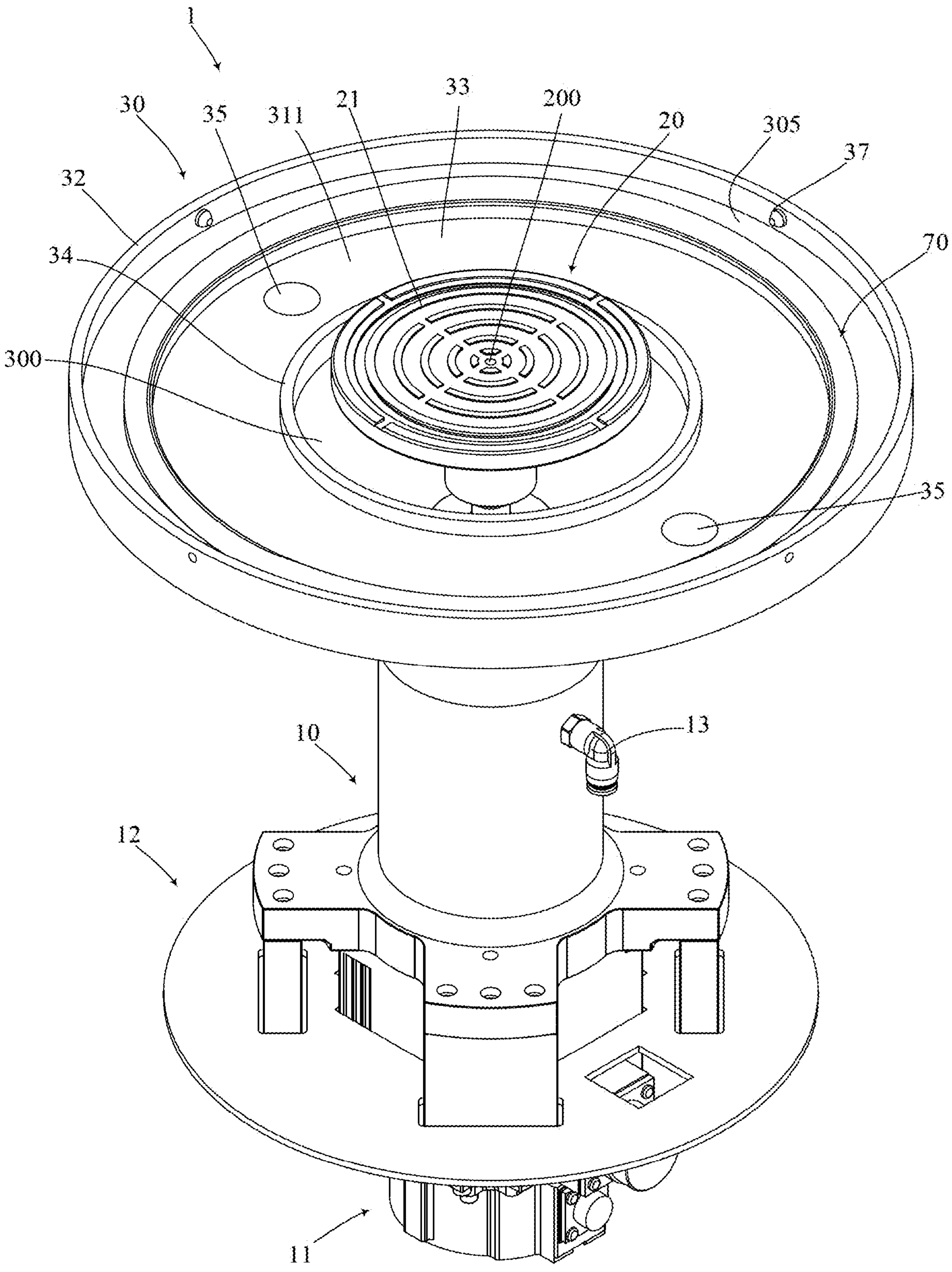
FIG. 1 is a perspective view of a multifunctional single wafer soaking-spinning-cleaning device of the present invention.
Figure 2:
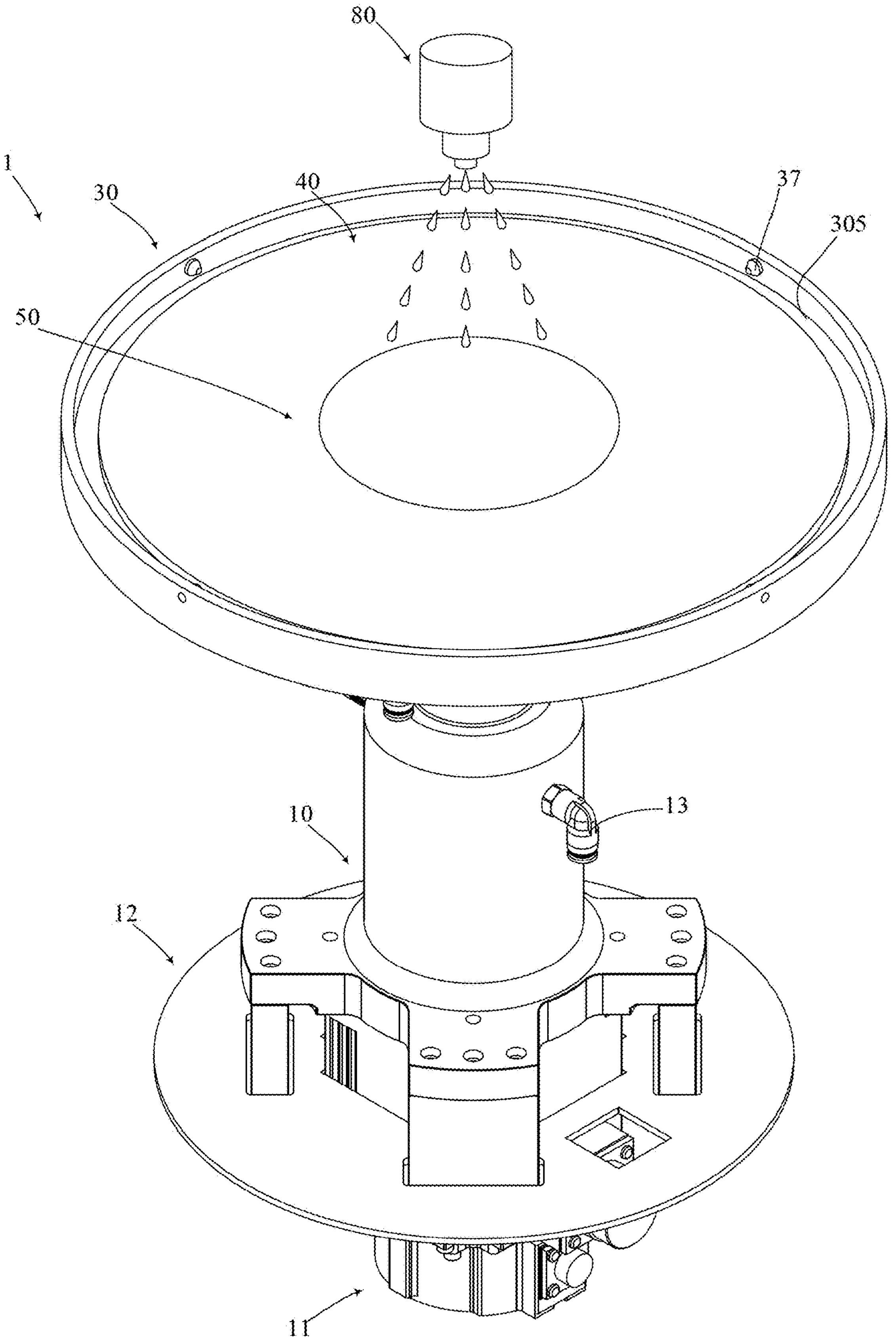
FIG. 2 is a perspective view of the multifunctional single wafer soaking-spinning-cleaning device of the present invention placed with a wafer and injected with a solution, wherein a process nozzle is located above the multifunctional single wafer soaking-spinning-cleaning device.
Figure 3:
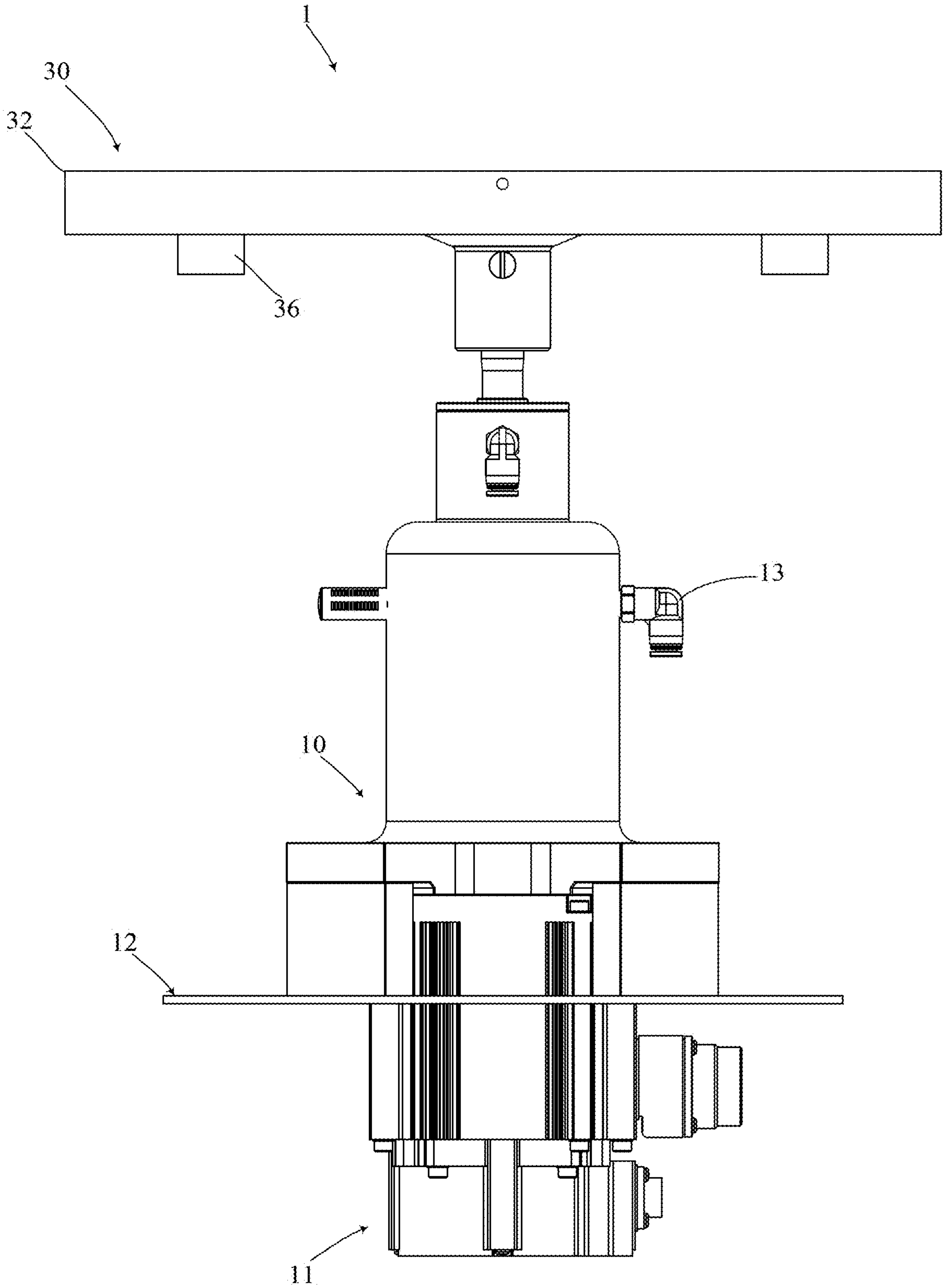
FIG. 3 is a side view of the multifunctional single wafer soaking-spinning-cleaning device of the present invention.

With reference to FIGS. 1 to 3, multifunctional single wafer soaking-spinning-cleaning device 1 of the present invention comprises: a spin driver device 10, a wafer spin chuck 20, and a wafer support disk 30.

The wafer spin chuck 20 is connected to the spin driver device 10 is driven by the spin driver device 10 to rotate, and is configured to fasten a wafer 40 placed on a top surface 21 of the wafer spin chuck 20.

The wafer support disk 30 is annular and surrounds the wafer spin chuck 20 outer side and is configured to ascend relative to the wafer spin chuck 20 to a wafer supporting position or descend relative to the wafer spin chuck 20 to a wafer separation position. The wafer support disk 30 comprises a base disk portion 31 and an outer annular wall portion 32 protruding from an outer edge of the base disk portion 31. A soaking trough 305 is formed between the base disk portion 31 and the outer annular wall portion 32 and is configured to accommodate the wafer 40. The soaking trough 305 can be injected with a solution 50 or pure water by a process nozzle 80 located above the wafer spin chuck 20 such that the solution 50 can be coated on the wafer 40 for implementation of a cleaning or etching process. A watertight sealing contact pad 70 is disposed on the wafer contact top surface 311 of the base disk portion 31 and is configured to watertightly contact the wafer 40. An accommodation hole 300 is defined through the wafer support disk 30, communicates with the soaking trough 305 and is configured to allow the wafer spin chuck 20 to enter or exit out of the accommodation hole 300. Furthermore, the above solution 50 injected into the soaking trough 305 can be a cleaning solution 50 or an etching solution 50, it can vary depending on demands of the wafer process. Furthermore, the above process nozzle 80 is usually a main spray device for spraying the solution 50 or pure water, can be connected to a storage container for a solution or pure water, and is configured to spray of the solution 50 or pure water during implementation of soaking and spin-cleaning steps for the wafer 40.

When the wafer support disk 30 ascends to the wafer supporting position, the wafer contact top surface 311 of the base disk portion 31 is flush with the top surface 21 of the wafer spin chuck 20. When the wafer support disk 30 descends to the wafer separation position, the wafer contact top surface 311 of the base disk portion 31 is lower than the top surface 21 of the wafer spin chuck 20.

In particular, the wafer supporting position is higher than the wafer separation position. When the wafer support disk 30 is located at the wafer supporting position, the base disk portion 31 can tightly contact a bottom portion of the wafer 40 to form a substantially or completely airtight or watertight state between the base disk portion 31 and the bottom portion of the wafer 40, which prevents a solution 50 from leaking out of the wafer support disk 30 from the bottom portion of the wafer 40. When the wafer support disk 30 is located at the lower wafer separation position, the base disk portion 31 is separated from the bottom portion of the wafer 40 to cancel the airtight or watertight state. At this time, the solution 50 can flow under the bottom portion of the wafer 40 to be discharged by a gap around the wafer support disk 30.

With further reference to FIGS. 4 and 7 to 9, in a preferred embodiment of the present invention, the watertight sealing contact pad 70, 70*a*, 70*b*, 70*c* is annular and partially or fully covers the wafer contact top surface 311.

Figure 4:
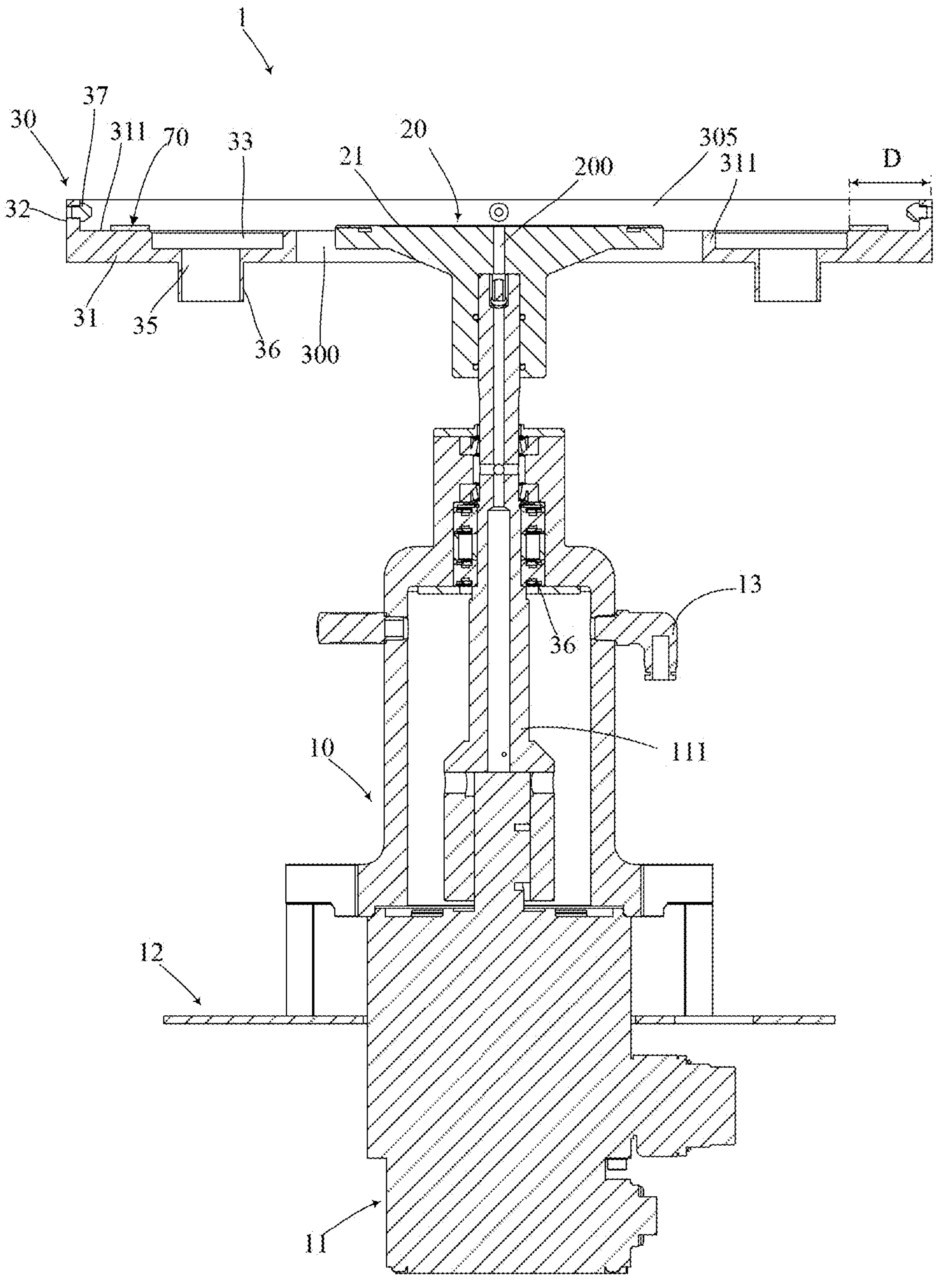
FIG. 4 is a cross-sectional side view of the multifunctional single wafer soaking-spinning-cleaning device of the present invention.

With further reference to FIGS. 3 and 4, in a preferred embodiment of the present invention, a liquid collection trough 33 is formed on the wafer contact top surface 311 of the base disk portion 31 of the wafer support disk 30, and the liquid collection trough 33 is located under the soaking trough 305 and communicating with the soaking trough 305. In a preferred embodiment of the present invention, the liquid collection trough 33 is annular, an inner annular wall portion 34 is formed on the base disk portion 31 and is located between the liquid collection trough 33 and the accommodation hole 300 to prevent a solution 50 or water from leaking out from the liquid collection trough 33 into the accommodation hole 300. Because a bottom of the accommodation hole 300 corresponding to the spin driver device 10 would not necessarily have any apparatus for collecting water apparatus, the inner annular wall portion 34 can effectively prevent the solution 50 or water from leaking inadvertently out from the accommodation hole 300. Furthermore, the liquid collection trough 33 can also be a non-annular structure. For example, it can be multiple liquid collection troughs 33 separated from one another, and the multiple liquid collection troughs 33 are arranged to surround the accommodation hole 300. The liquid collection trough 33 is mainly used for collecting the solution 50 or water applied to the wafer 40 to further discharge and recycle the solution 50 or water from the wafer support disk 30.

Figure 7:
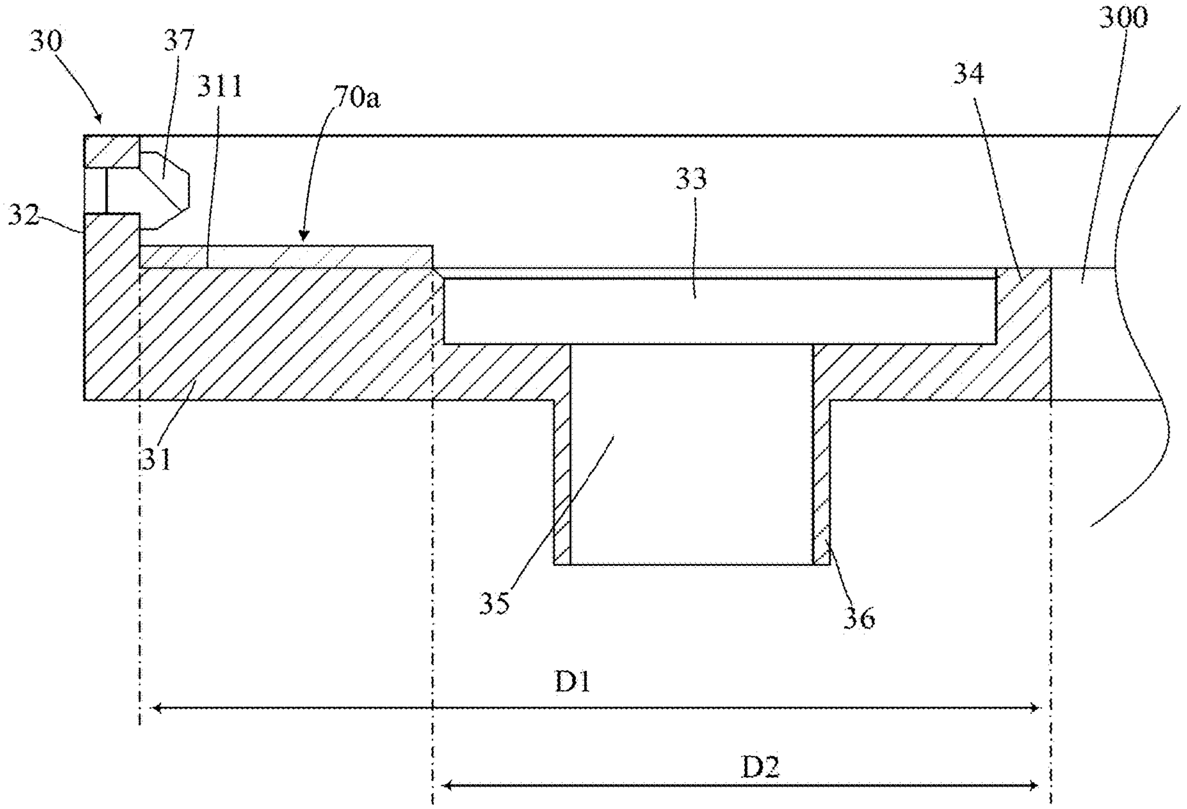
FIG. 7 is a partially enlarged cross-sectional side view of the multifunctional single wafer soaking-spinning-cleaning device of the present invention an embodiment, wherein the watertight sealing contact pad surrounds the liquid collection trough, and partially covers the wafer contact top surface.
Figure 8:
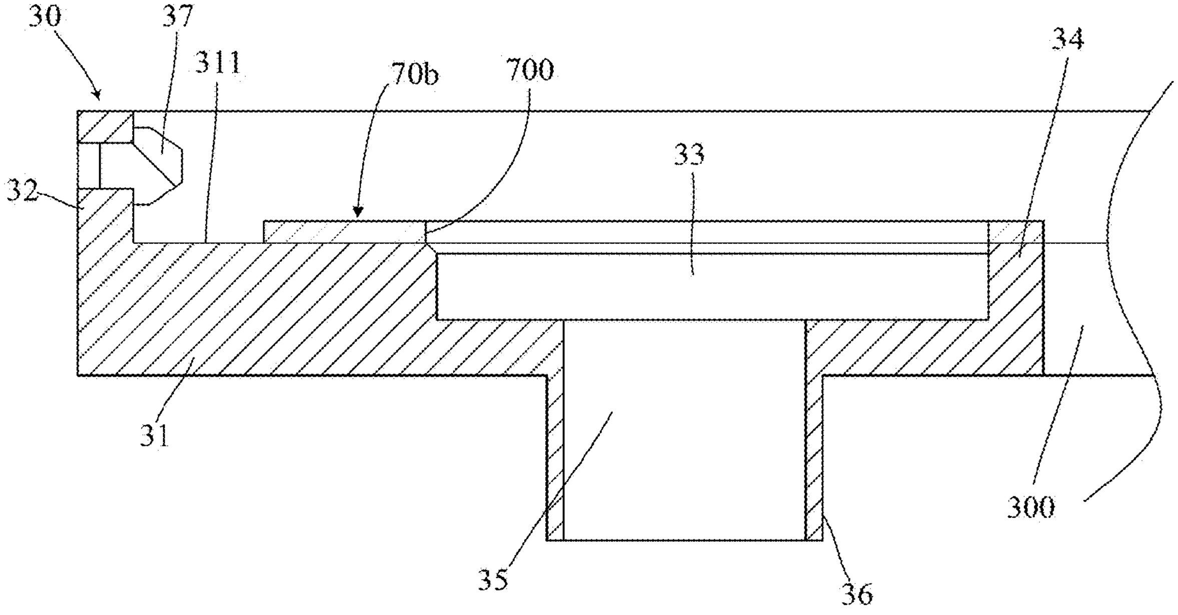
FIG. 8 is a partially enlarged cross-sectional side view of the multifunctional single wafer soaking-spinning-cleaning device of the present invention another embodiment, wherein the watertight sealing contact pad is distributed on the liquid collection trough, comprises a through hole aligned with the liquid collection trough, and partially covers the wafer contact top surface.
Figure 9:
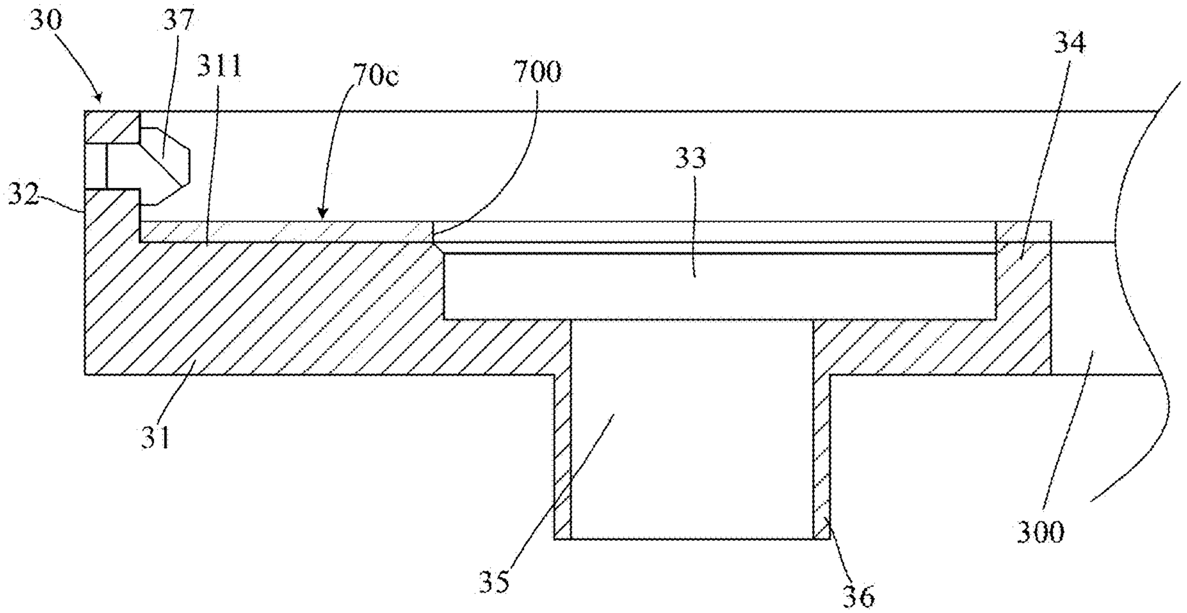
FIG. 9 is a partially enlarged cross-sectional side view of still another embodiment of the multifunctional single wafer soaking-spinning-cleaning device of the present invention, wherein the watertight sealing contact pad is distributed above the liquid collection trough, comprises a through hole aligned with the liquid collection trough, and the watertight sealing contact pad fully covers the wafer contact top surface.

In a preferred embodiment of the present invention, the watertight sealing contact pad 70, 70*a* is annular and surrounds the liquid collection trough 33, as shown in FIGS. 4 and 7.

In a preferred embodiment of the present invention, the watertight sealing contact pad 70*b*, 70*c* is annular and is distributed above the liquid collection trough 33. A distance D1 from an annular outer side of the watertight sealing contact pad 70*b*, 70*c* to the accommodation hole 300 is greater than a farthest distance D2 between the liquid collection trough 33 and the accommodation hole. At least one through hole 700 is defined through the watertight sealing contact pad 70*b*, 70*c* and is aligned with communicates with the liquid collection trough 33.

In a preferred embodiment of the present invention, a top end of the inner annular wall portion 34 is flush with the wafer contact top surface 311.

In a preferred embodiment of the present invention, the liquid collection trough 33 and the outer annular wall portion 32 is at an interval D, as shown in FIG. 4. The interval D makes the wafer contact top surface 311 of the base disk portion 31 have a sufficient area contacting the wafer 40.

In a preferred embodiment of the present invention, at least one liquid discharge hole 35 is defined through the base disk portion 31 and communicates with the liquid collection trough 33 for discharging solution 50 or water in the liquid collection trough 33.

In a preferred embodiment of the present invention, a discharge pipe 36 protrudes from a bottom surface of the base disk portion 31 and corresponds to the liquid discharge hole 35. The discharge pipe 36 can be further connected to an external pipe for discharging the solution 50 or water out from the liquid collection trough 33.

In a preferred embodiment of the present invention, the wafer contact top surface 311 of the base disk portion 31 is a flat surface. The flat surface can excellently contact the bottom portion of the wafer 40 in a large area to approximately form airtight or watertight state to prevent the solution 50 or water from flowing into the liquid collection trough 33 below the wafer 40 before sufficiently reacting with a surface of the wafer 40 to achieve cleaning or etching purpose, which improves efficiency of the wafer process.

In a preferred embodiment of the present invention, a vacuum pump connection port 13 is disposed on the spin driver device 10, and a vacuum suction hole 200 is formed through the wafer spin chuck and communicates with the vacuum pump connection port 13. The vacuum suction hole 200 is configured to secure the wafer on the wafer spin chuck 20.

In a preferred embodiment of the present invention, at least one liquid nozzle 37 is disposed on the outer annular wall portion 32 of the wafer support disk 30 and extends into the soaking trough 305. The liquid nozzle 37 is connected to an external liquid supply device filled with pure water to spray pure water into the soaking trough 305 for washing the wafer support disk 30. Furthermore, the liquid nozzle 37 and the process nozzle 80 are independent devices, and one of the liquid nozzle 37 and the process nozzle 80 can spray the solution 50 or pure water depending on demands of the wafer cleaning and etching process. Alternatively, the liquid nozzle 37 and the process nozzle 80 can spray solutions 50 of different types or pure water in different cleaning steps respectively.

Figure 5:
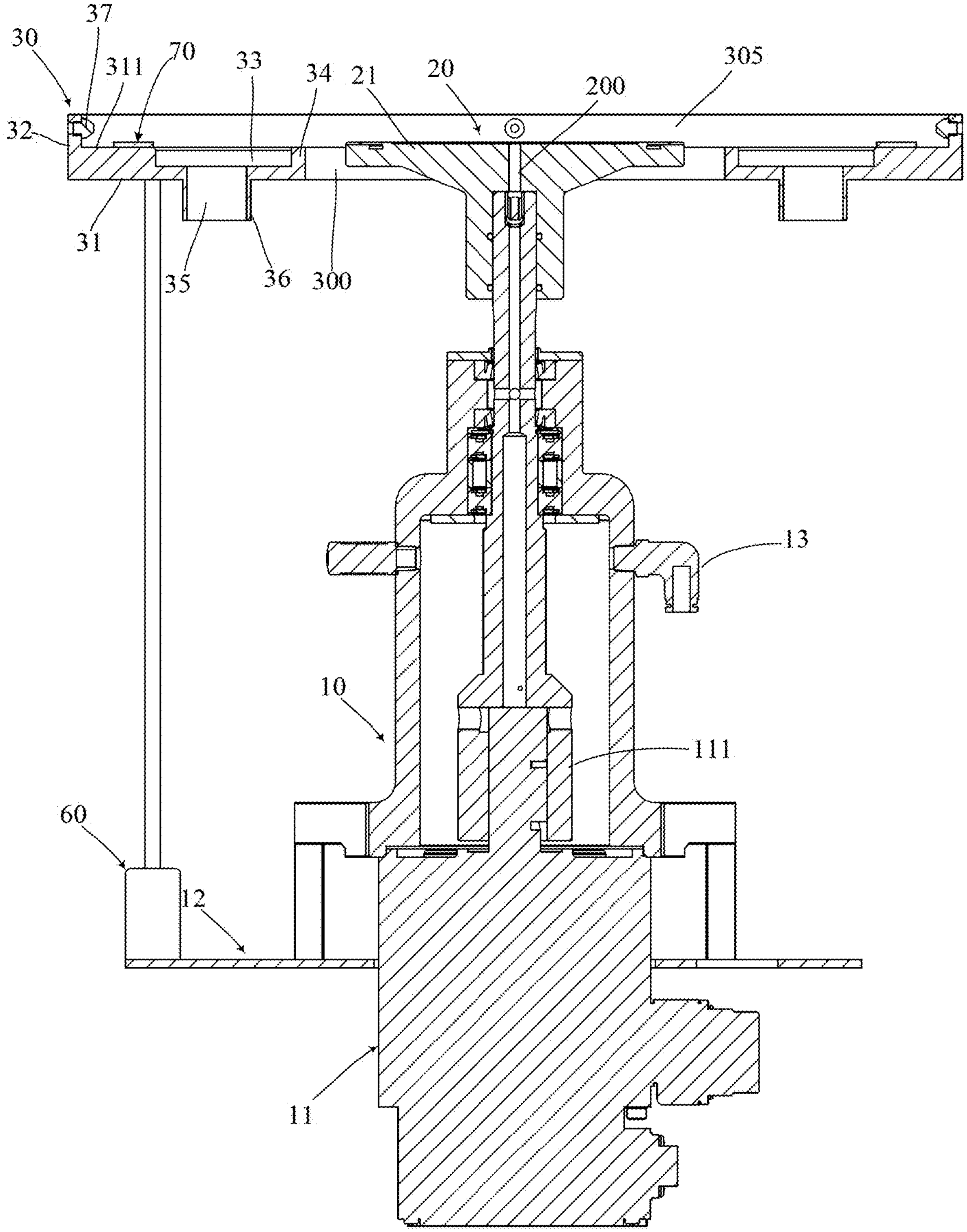
FIG. 5 is a cross-sectional side view of an embodiment of the multifunctional single wafer soaking-spinning-cleaning device of the present invention.

With reference to FIG. 5, in a preferred embodiment of the present invention, the wafer support disk 30 is connected to a lifting drive mechanism 60, and the lifting drive mechanism 60 is configured to drive the wafer support disk 30 to ascend or descend relative to the wafer spin chuck 20.

Figure 6:
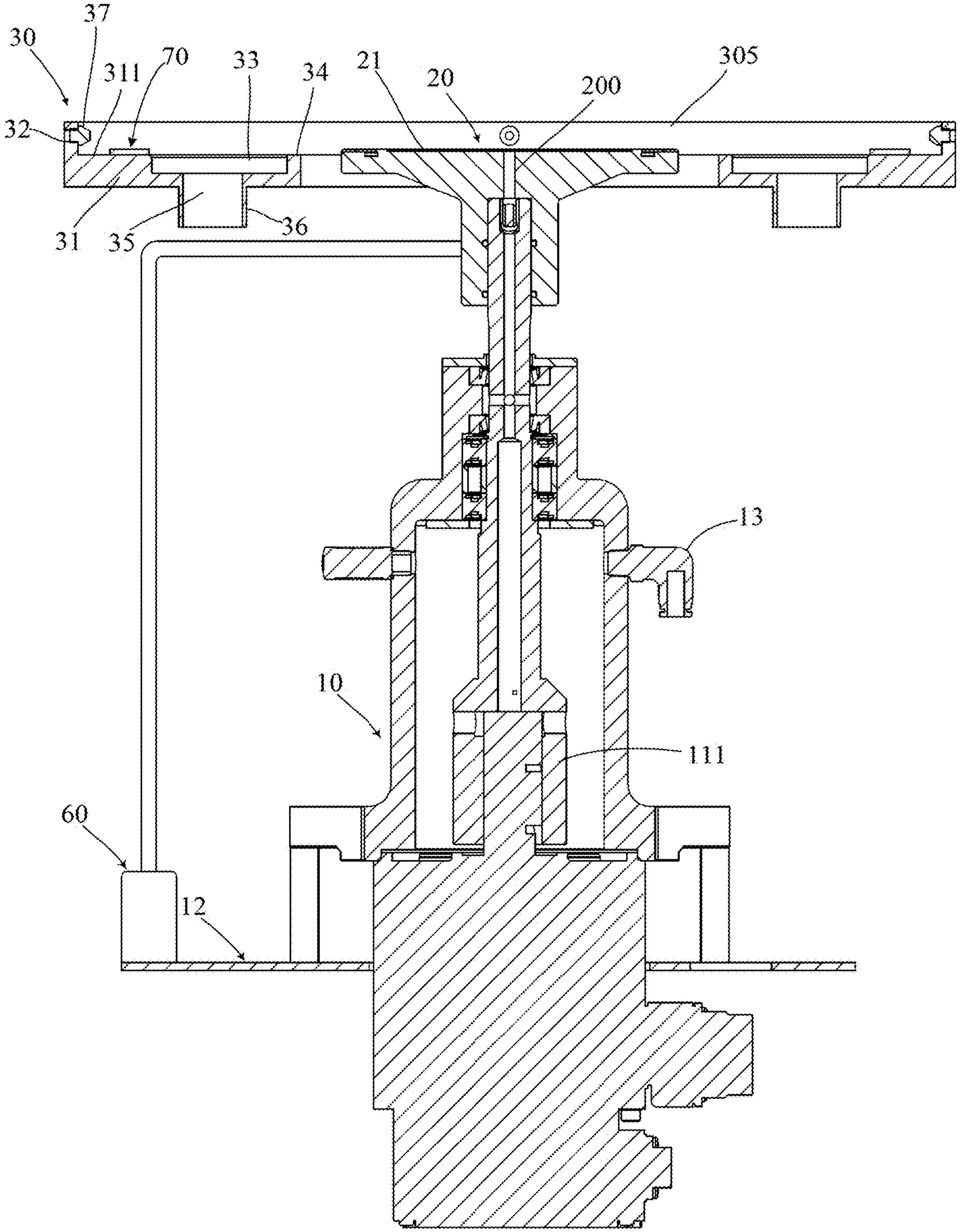
FIG. 6 is a cross-sectional side view of another embodiment of the multifunctional single wafer soaking-spinning-cleaning device of the present invention.

With reference to FIG. 6, in another embodiment of the present invention, the wafer spin chuck 20 is connected to a lifting drive mechanism 60, and the lifting drive mechanism 60 is configured to drive the wafer spin chuck 20 to ascend or descend relative to the wafer support disk 30. At this time, the wafer spin chuck 20 can move upward and downward relative to the spin driver device 10 by a mechanism such as a slider (pneumatic cylinder, telescopic tube, etc.), for example, the wafer spin chuck 20 slided upward and downward by a slider sleeve mounted around a spin shaft of the spin driver device 10. At this time, the wafer support disk 30 by other fastener is secured to the spin driver device 10 or the ground and does not move upward or downward.

In a preferred embodiment of the present invention, the lifting drive mechanism 60 is mounted securely on the spin driver device 1 by a bracket 12, as shown in FIG. 6. Furthermore, in a preferred embodiment of the present invention, the lifting drive mechanism 60 is one of a pneumatic cylinder, a hydraulic cylinder, an electromagnetic valve, and a motor.

In a preferred embodiment of the present invention, the spin driver device 10 comprises a motor 11. The motor 11 is connected to the wafer spin chuck 20 by a spin shaft 111 to be configured to drive the wafer spin chuck 20 to spin. The motor 11 can be a variable speed motor 11 to adjust a speed according to different wafers 40, solutions 50, or processes such that the wafer spin chuck 20 can spin at a suitable speed to achieve a highly efficient solution coating or spin-drying effect.

Figure 10:
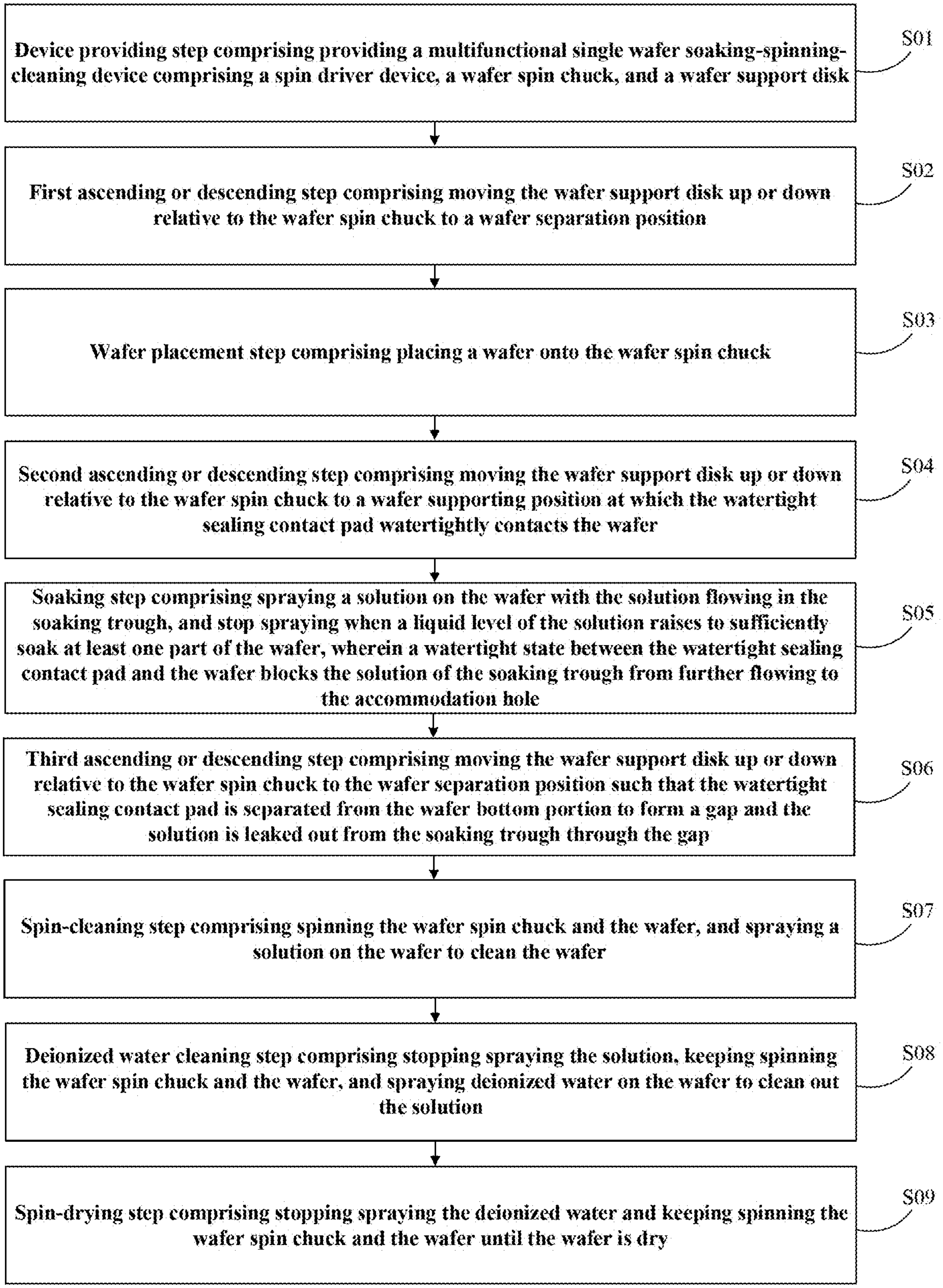
FIG. 10 is a flowchart of a wafer processing method of the present invention.

With reference to FIG. 10, the present invention wafer processing method comprises: a device providing step S01, a first ascending or descending step S02, a wafer placement step S03, a second ascending or descending step S04, a soaking step S05, a third ascending or descending step S06, and a spin-cleaning step S07.

The device providing step S01 comprises providing a multifunctional single wafer soaking-spinning-cleaning device 1 of any embodiment as shown in FIGS. 1 to 8. The multifunctional single wafer soaking-spinning-cleaning device 1 comprises: a spin driver device 10, a wafer spin chuck 20, and a wafer support disk 30.

The wafer spin chuck 20 is connected to the spin driver device 10 and is driven by the spin driver device 10 to rotate.

The wafer support disk 30 is annular and surrounds the wafer spin chuck 20 outer side and is configured to ascend or descend relative to the wafer spin chuck 20. The wafer support disk 30 comprises a base disk portion 31 and an outer annular wall portion 32 protruding from an outer edge of the base disk portion 31. A soaking trough 305 is formed between the base disk portion 31 and the outer annular wall portion 32 and is configured to accommodate a wafer 40. A watertight sealing contact pad 70 is disposed on the wafer contact top surface 311 of the base disk portion 31. A accommodation hole 300 is defined through the wafer support disk 30 and communicates with the soaking trough 305. With further reference to FIGS. 4 and 7 to 9, in a preferred embodiment of the present invention, the watertight sealing contact pad 70, 70*a*, 70*b*, 70*c* is annular and partially or fully covers the wafer contact top surface 311.

Figure 11:
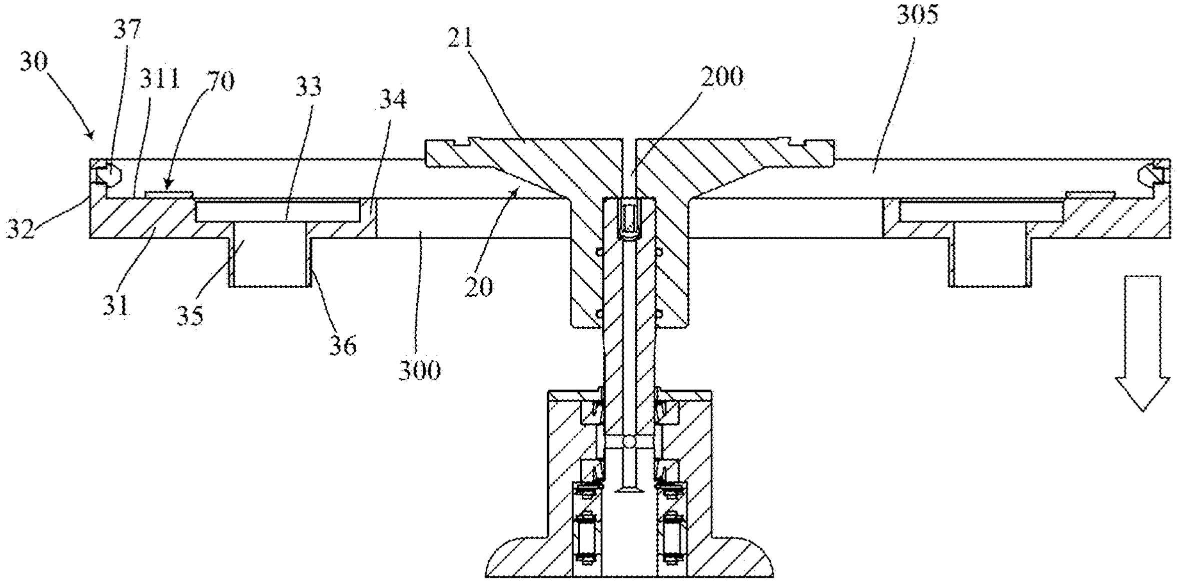
FIG. 11 is an operational cross-sectional side view of the multifunctional single wafer soaking-spinning-cleaning device of the present invention corresponding to a first ascending or descending step.

With further reference to FIG. 11, the first ascending or descending step S02 comprises moving the wafer support disk 30 up or down relative to the wafer spin chuck 20 to a wafer separation position.

Figure 12:
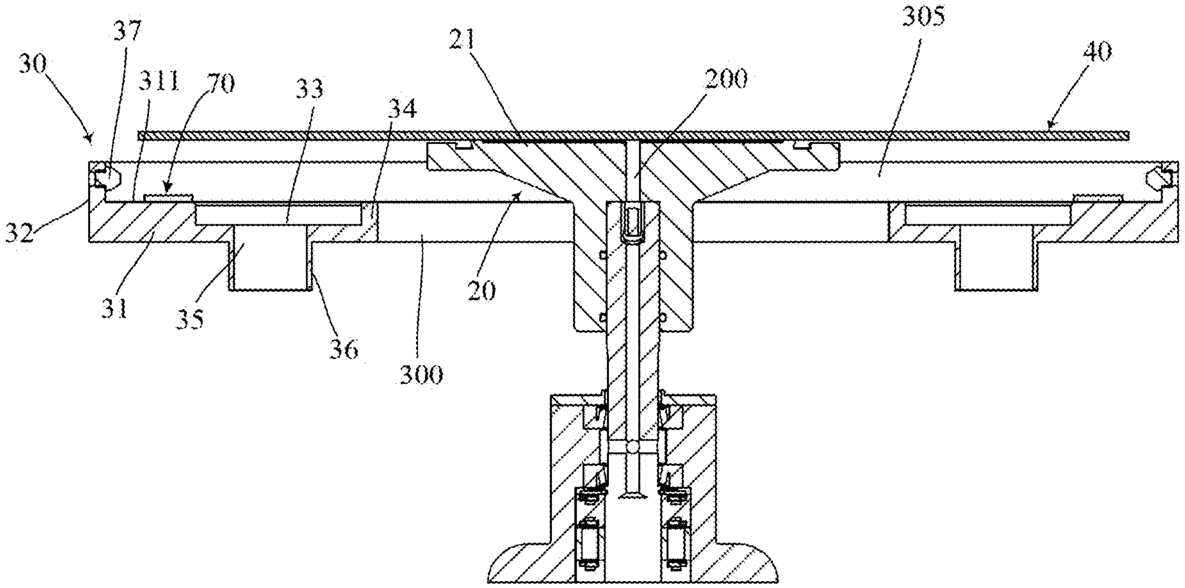
FIG. 12 is an operational cross-sectional side view of the multifunctional single wafer soaking-spinning-cleaning device of the present invention corresponding to a wafer placement step.

With further reference to FIG. 12, the wafer placement step S03 comprises placing a wafer 40 on the wafer spin chuck 20. The wafer spin chuck 20 can provide a suction force to the wafer 40 to securely suck and fasten the wafer 40 on the wafer spin chuck 20.

Figure 13:
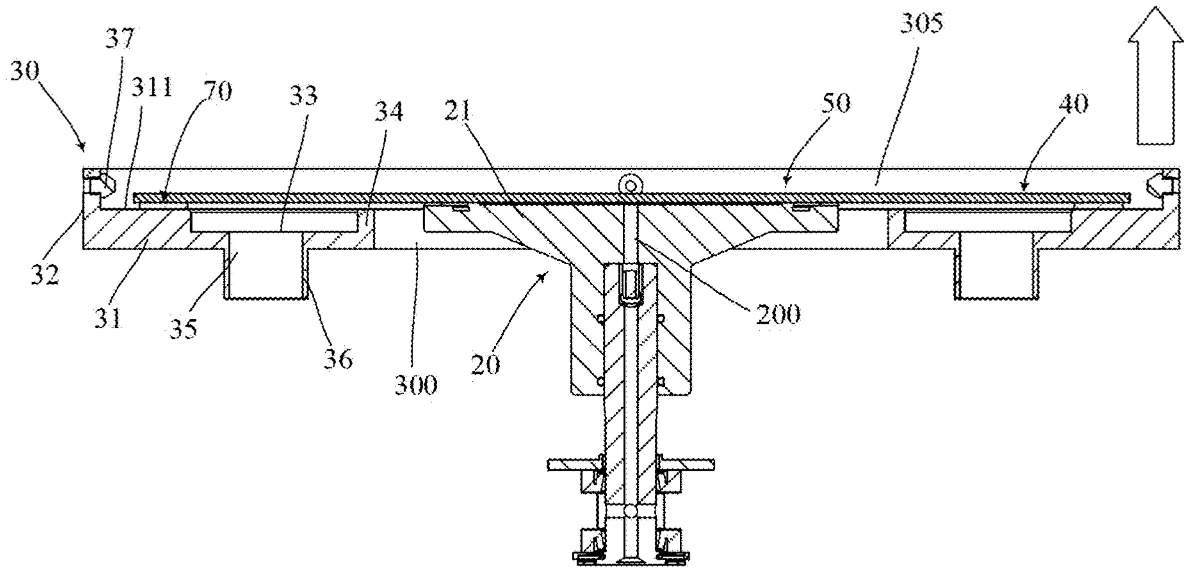
FIG. 13 is an operational cross-sectional side view of the multifunctional single wafer soaking-spinning-cleaning device of the present invention corresponding to a second ascending or descending step.

With further reference to FIG. 13, the second ascending or descending step S04 comprises moving the wafer support disk 30 relative to the wafer spin chuck 20 up or down a wafer supporting position. At this time, the watertight sealing contact pad 70 watertightly contacts the wafer 40. Material of the watertight sealing contact pad 70 can be soft and elastic material such as natural or artificial rubber or plastic to provide a sufficient watertight characteristic. Furthermore, the watertight sealing contact pad 70 can has a complete watertight characteristic such that during a period of lifespan of the watertight sealing contact pad 70 without deformation or deterioration, the watertight sealing contact pad 70 contacting the wafer 40 can provide a full watertight function without allowing liquid to pass through a contact interface between the watertight sealing contact pad 70 and the wafer 40. The watertight sealing contact pad 70 also has a substantial watertight characteristic such that during a period of lifespan of the watertight sealing contact pad 70 without deformation or deterioration, the contact interface between the watertight sealing contact pad 70 the wafer 40 can provide a watertight function that only allows negligible leakage.

Figure 14:
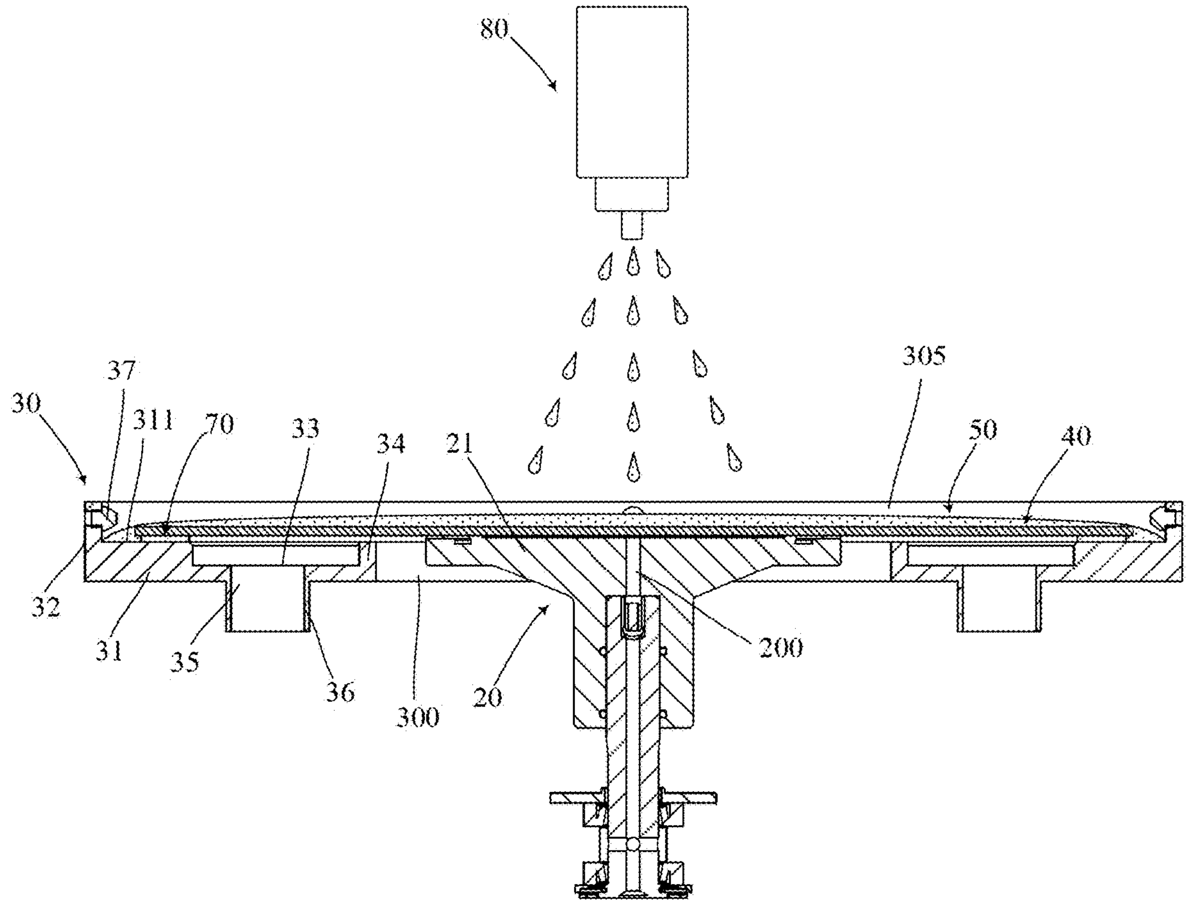
FIG. 14 is an operational cross-sectional side view of the multifunctional single wafer soaking-spinning-cleaning device of the present invention corresponding to a soaking step.

With further reference to FIG. 14, the soaking step S05 comprises spraying a solution on the wafer 40 with the solution flowing in the soaking trough 305, and stopping spraying when a liquid level of the solution is raised sufficiently to soak at least one part of the wafer 40. At this time, a watertight state between the watertight sealing contact pad 70 and the wafer 40 blocks the solution of the soaking trough 305 further flowing to the accommodation hole 300. The solution used here is sprayed out from a process nozzle 80 located above the wafer 40 for removing photoresist from the wafer.

Figure 15:
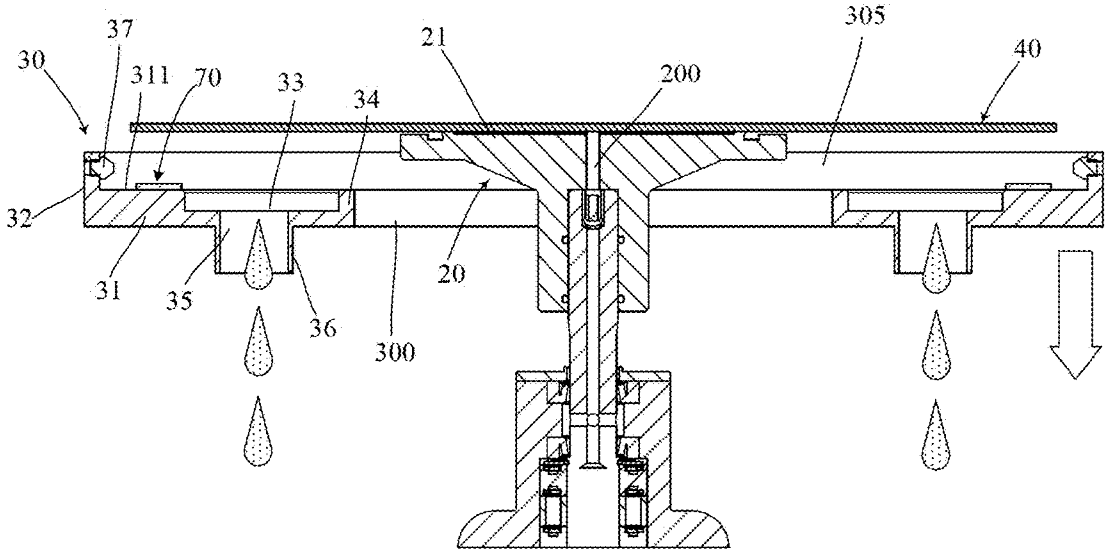
FIG. 15 is an operational cross-sectional side view of the multifunctional single wafer soaking-spinning-cleaning device of the present invention corresponding to a third ascending or descending step.

With further reference to FIG. 15, the third ascending or descending step S06 comprises moving the wafer support disk 30 up or down relative to the wafer spin chuck 20 to the wafer separation position such that the watertight sealing contact pad 70 is separated from the wafer bottom portion to form a gap and the solution is leaked out from the soaking trough 305 through the gap.

Figure 16:
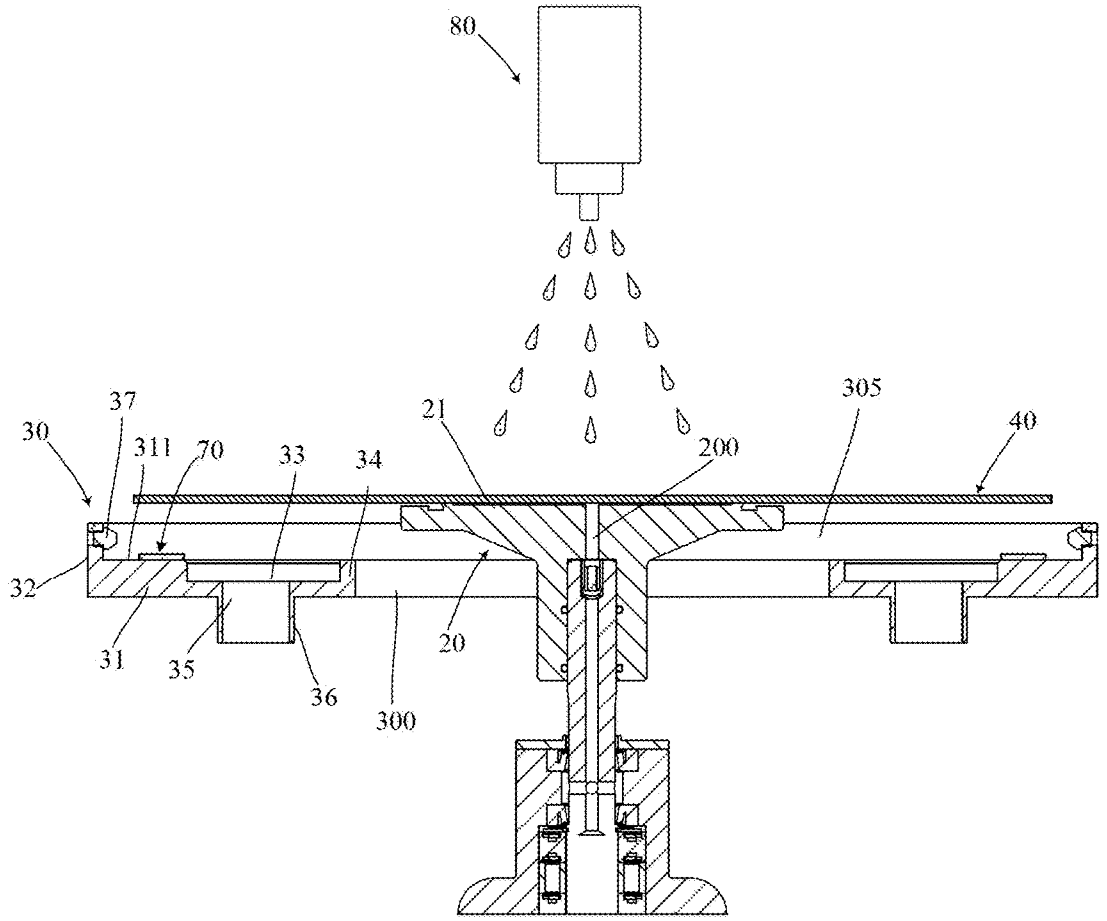
FIG. 16 is an operational cross-sectional side view of the multifunctional single wafer soaking-spinning-cleaning device of the present invention corresponding to a spin-cleaning step.

With further reference to FIG. 16, the spin-cleaning step S07 comprises spinning the wafer spin chuck 20 and the wafer, and spraying the solution on the wafer to clean the wafer 40. The solution used here is for removing the photoresist from the wafer 40. Furthermore, the solutions used in the soaking step S05 and the spin-cleaning step S07 can be the same or different, or can be solutions of the same type but in different ingredient proportions.

In a preferred embodiment of the present invention, after the spin-cleaning step S07, the wafer processing method further comprises: a deionized water cleaning step S08 comprising stopping spraying the solution, keeping spinning the wafer spin chuck 20 and the wafer 40, and spraying deionized water on the wafer 40 to clean out the solution; and a spin-drying step S09 comprising stopping spraying the deionized water and keeping spinning the wafer spin chuck 20 and the wafer 40 until the wafer 40 is dry completely.

In a preferred embodiment of the present invention, when the wafer support disk 30 ascends to the wafer supporting position, the watertight sealing contact pad 70 of the base disk portion 31 is flush with the top surface of the wafer spin chuck 20. When the wafer support disk 30 descends to the wafer separation position, the watertight sealing contact pad 70 of the base disk portion 31 is lower than the top surface of the wafer spin chuck 20.

In a preferred embodiment of the present invention, the watertight sealing contact pad 70 is annular and partially or fully covers the wafer contact top surface 311.

In a preferred embodiment of the present invention, a liquid collection trough 33 is formed on the wafer contact top surface 311 of the base disk portion 31 of the wafer support disk 30, and the liquid collection trough 33 is located under the soaking trough 305 and communicating with the soaking trough 305.

In a preferred embodiment of the present invention, the watertight sealing contact pad 70 is annular and surrounds the liquid collection trough 33.

In a preferred embodiment of the present invention, the watertight sealing contact pad 70 is annular and is distributed above the liquid collection trough 33, a distance D1 from an annular outer side of the watertight sealing contact pad 70 to the accommodation hole 300 is greater than a farthest distance D2 between the liquid collection trough 33 and the accommodation hole 300. At least one through hole 700 is defined through the watertight sealing contact pad 70 and is aligned with and communicates with the liquid collection trough 33.

In a preferred embodiment of the present invention, the liquid collection trough 33 is annular, and an inner annular wall portion 34 is formed on the base disk portion 31 and is located between the liquid collection trough 33 and the accommodation hole 300.

Multifunctional single wafer soaking-spinning-cleaning device 1 of the present invention at least comprises advantages as follows:

1. The multifunctional single wafer soaking-spinning-cleaning device 1 and the wafer processing method applying the device of the present invention dispose a wafer support disk 30 surrounding a periphery of a wafer spin chuck 20. The wafer support disk 30 is annular and can accommodate a wafer spin chuck 20, an outer edge of the wafer support disk 30 is a protruding outer annular wall portion. When the wafer support disk 30 ascends to the wafer supporting position and is at the same level with the wafer spin chuck 20, the wafer support disk 30 exactly tightly supports and surrounds a side surface and a bottom portion of the wafer 40 and makes the wafer 40 seal an accommodation hole 300 in a center of the wafer support disk 30 such that a solution 50 sprayed on the wafer can keep a liquid level in the soaking trough 305 without leaking out from the accommodation hole 300, and therefore to make the solution 50 to perform a sufficiently soaking effect to the wafer 40 in the soaking trough 305.

2. The watertight sealing contact pad 70 can watertightly contact the wafer 40 to prevent solution 50 in the soaking trough 305 from flowing into the liquid collection trough 33 and leaking out from a bottom of the wafer support disk 30, which can maintain a sufficient liquid level of the solution 50 in the soaking trough 305 to implement a fully soaking process to the wafer 40.

3. After the above soaking step is completed, the wafer support disk 30 can descend to the wafer separation position such that the wafer rises relative to the wafer support disk 30 to make the solution 50 flow into the liquid collection trough 33 of the wafer support disk 30, and is further discharged from the liquid discharge hole 35. Alternatively, the accommodation hole 300 can also be designed to have liquid guide and drainage effects. After the wafer support disk 30 descends to the wafer separation position, the spin driver device 10 can drive the wafer spin chuck 20 and the wafer 40 secured on the wafer spin chuck 20 by the vacuum suction force to perform the subsequent cleaning and spin-drying steps to achieve spin cleaning and drying effects to the wafer.

4. According to demands of wafer processes, the solution 50 injected from the process nozzle above the wafer onto the wafer 40 in the soaking trough 305 can be a cleaning solution 50 or an etching solution 50, and can be deionized water. When the solution 50 is an etching or cleaning solution 50, the wafer support disk 30 at the wafer supporting position can keep a liquid level of the etching or cleaning solution 50 such that the etching or cleaning solution 50 sufficiently performs the etching or cleaning effect. After the etching or cleaning step is completed, the wafer support disk 30 descends again to the wafer separation position such that the etching solution 50 can be discharged out from the wafer support disk 30.

5. It is known according to the above four points that the multifunctional single wafer soaking-spinning-cleaning device 1 of the present invention can perform continuous single wafer soaking, spin cleaning, etching, and spin-drying processes on the same wafer spin chuck 20. Therefore, the present invention can effectively prevent an issue of the above continuous processes requiring a transfer robot to steadily move wafer to independent apparatuses to implement corresponding steps to further simplify wafer cleaning or etching process, reduce the wafer damaging due to frequent wafer transfer, and further improve efficiency and yield of the wafer process.

What is claimed is:

1. A wafer processing method, comprising:

a device providing step comprising providing a multifunctional single wafer soaking-spinning-cleaning device comprising:

a spin driver device;

a wafer spin chuck connected to the spin driver device, driven by the spin driver device to spin, and configured to fasten a wafer placed on a top surface of the wafer spin chuck; and a wafer support disk being annular, surrounding an outer side of the wafer spin chuck, and configured to ascend or descend relative to the wafer spin chuck, wherein the wafer support disk comprises a base disk portion and an outer annular wall portion protruding from an outer edge of the base disk portion, a soaking trough is formed between the base disk portion and the outer annular wall portion and is configured to accommodate the wafer, a watertight sealing contact pad is disposed on a wafer contact top surface of the base disk portion, and an accommodation hole is defined through the wafer support disk and communicates with the soaking trough, wherein a liquid collection trough is formed in the wafer contact top surface of the base disk portion of the wafer support disk, and the liquid collection trough is located below the soaking trough and communicates with the soaking trough;

a first ascending or descending step comprising moving the wafer support disk up or down relative to the wafer spin chuck to a wafer separation position;

a wafer placement step comprising placing a wafer onto the wafer spin chuck;

a second ascending or descending step comprising moving the wafer support disk up or down relative to the wafer spin chuck to a wafer supporting position at which the watertight sealing contact pad watertightly contacts the wafer;

a soaking step comprising spraying a solution on the wafer with the solution flowing in the soaking trough, and stopping spraying when a liquid level of the solution raises to sufficiently soak at least one part of the wafer, wherein a watertight state between the watertight sealing contact pad and the wafer blocks the solution of the soaking trough from further flowing to the accommodation hole;

a third ascending or descending step comprising moving the wafer support disk up or down relative to the wafer spin chuck to the wafer separation position such that the watertight sealing contact pad is separated from the wafer bottom portion to form a gap and the solution is leaked out from the soaking trough through the gap; and a spin-cleaning step comprising spinning the wafer spin chuck and the wafer, and spraying a solution on the wafer to clean the wafer.

2. The wafer processing method according to claim 1, after the spin-cleaning step, further comprising:

a deionized water cleaning step comprising stopping spraying the solution, keeping spinning the wafer spin chuck and the wafer, and spraying deionized water on the wafer to clean out the solution; and a spin-drying step comprising stopping spraying the deionized water and keeping spinning the wafer spin chuck and the wafer until the wafer is dry.

3. The wafer processing method according to claim 1, wherein when the wafer support disk ascends to the wafer supporting position, the watertight sealing contact pad of the base disk portion is flush with the top surface of the wafer spin chuck; and when the wafer support disk descends to the wafer separation position, the watertight sealing contact pad of the base disk portion is lower than the top surface of the wafer spin chuck.

4. The wafer processing method according to claim 1, wherein the watertight sealing contact pad is annular and partially or fully covers the wafer contact top surface.

5. The wafer processing method according to claim 1, wherein the watertight sealing contact pad is annular and surrounds the liquid collection trough.

6. The wafer processing method according to claim 1, wherein the watertight sealing contact pad is annular and is distributed above the liquid collection trough, a distance from an annular outer side of the watertight sealing contact pad to the accommodation hole is greater than a farthest distance between the liquid collection trough and the accommodation hole, and at least one through hole is defined through the watertight sealing contact pad and is aligned with and communicates with the liquid collection trough.

7. The wafer processing method according to claim 1, wherein the liquid collection trough is annular, and an inner annular wall portion is formed on the base disk portion between the liquid collection trough and the accommodation hole.

* * * * *